(12) United States Patent
Bioglio et al.

(10) Patent No.: US 11,190,214 B2
(45) Date of Patent: Nov. 30, 2021

(54) CONSTRUCTION OF A POLAR CODE BASED ON A DISTANCE CRITERION AND A RELIABILITY CRITERION, IN PARTICULAR OF A MULTI-KERNEL POLAR CODE

(71) Applicant: Huawei Technologies Co., Ltd., Shenzhen (CN)

(72) Inventors: Valerio Bioglio, Boulogne Billancourt (FR); Ingmar Land, Boulogne Billancourt (FR); Jean-Claude Belfiore, Boulogne Billancourt (FR); Frederic Gabry, Boulogne Billancourt (FR)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/773,544

(22) Filed: Jan. 27, 2020

(65) Prior Publication Data

US 2020/0162111 A1    May 21, 2020

Related U.S. Application Data

(63) Continuation of application No. PCT/EP2017/068930, filed on Jul. 26, 2017.

(51) Int. Cl.
*H03M 13/13* (2006.01)
*H03M 13/45* (2006.01)

(52) U.S. Cl.
CPC ......... *H03M 13/13* (2013.01); *H03M 13/458* (2013.01)

(58) Field of Classification Search
CPC ... H03M 13/13; H03M 13/458; H03M 13/033
See application file for complete search history.

(56) References Cited

U.S. PATENT DOCUMENTS

2006/0176977 A1*  8/2006  Jafarkhani ............. B63B 35/03
                                                 375/298
2008/0177710 A1*  7/2008  Cha ....................... G06K 9/627
                        (Continued)

FOREIGN PATENT DOCUMENTS

CN      103684477 A      3/2014
CN      105811998 A      7/2016
                    (Continued)

OTHER PUBLICATIONS

Bioglio et al., "Minimum-Distance Based Construction of Multi-Kernel Polar Codes," XP055350908, total 6 pages. (Jan. 2017).
(Continued)

*Primary Examiner* — Thien Nguyen
(74) *Attorney, Agent, or Firm* — Leydig, Voit & Mayer, Ltd.

(57) ABSTRACT

The present disclosure relates to a device for generating a polar code $x_N$ of length N and dimension K on the basis of a transformation matrix $G_N$ of size N×N, wherein the transformation matrix $G_N$ is based on a first matrix $G_{N_r}$ of size $N_r \times N$, and on a second matrix $G_{N_d}$ of size $N_d \times N_d$, wherein $N = N_r \cdot N_d$, and wherein the polar code $x_N$ is given by $x_N = u_N \cdot G_N$, wherein $u_N = (u_0, \ldots u_{N-1})$ is a vector of size N, an element $u_i$, $i=0, \ldots N-1$, of the vector corresponding to an information bit if $i \in I$, I being a set of K information bit indices, and $u_i = 0$, if $i \in F$, F being a set of N-K frozen bit indices.

8 Claims, 4 Drawing Sheets

(56) References Cited

U.S. PATENT DOCUMENTS

| | | | |
|---|---|---|---|
| 2015/0194987 A1* | 7/2015 | Li | H04L 1/0057 714/752 |
| 2016/0308643 A1* | 10/2016 | Li | H03M 13/1105 |
| 2019/0305799 A1* | 10/2019 | Gabry | H03M 13/033 |

FOREIGN PATENT DOCUMENTS

| | | |
|---|---|---|
| CN | 106027071 A | 10/2016 |
| CN | 106685433 A | 5/2017 |
| CN | 106416083 B | 1/2020 |
| EP | 2899911 A1 | 7/2015 |
| KR | 20110060635 A | 6/2011 |
| WO | 2018033206 A1 | 2/2018 |
| WO | 2018113994 A1 | 6/2018 |

OTHER PUBLICATIONS

Arikan, "Channel Polarization: A Method for Constructing Capacity-Achieving Codes for Symmetric Binary-Input Memoryless Channels," IEEE Transactions on Information Theory, vol. 55, No. 7, pp. 3051-3073, Institute of Electrical and Electronics Engineers, New York, New York (Jul. 2009).

Vangala et al., "A Comparative Study of Polar Code Constructions for the AWGN Channel," arXiv:1501.02473v1, pp. 1-9 (Jan. 2015).

Wang et al., "A Novel Puncturing Scheme for Polar Codes," IEEE Communications Letters, vol. 18, No. 12, pp. 2081-2084, Institute of Electrical and Electronics Engineers, New York, New York (Dec. 2014).

Zhang et al., "On the Puncturing Patterns for Punctured Polar Codes," 2014 IEEE International Symposium on Information Theory (ISIT), pp. 121-125, Institute of Electrical and Electronics Engineers, New York, New York (Jul. 2014).

Kai Niu et al., "Beyond Turbo Codes: Rate-Compatible Punctured Polar Codes," IEEE ICC 2013—Communications Theory, pp. 3423-3427, Institute of Electrical and Electronics Engineers, New York, New York (Jun. 2013).

Tal et al., "List Decoding of Polar Codes," 2011 IEEE International Symposium on Information Theory Proceedings, pp. 1-5, Institute of Electrical and Electronics Engineers, New York, New York (Jul. 2011).

Mori et al., "Performance of Polar Codes with the Construction using Density Evolution," IEEE Communications Letters, vol. 13, No. 7, pp. 519-521, Institute of Electrical and Electronics Engineers, New York, New York (Jul. 2009).

Li et al., "A RM-Polar codes," XP055270196, pp. 1-2 (Jul. 2014).

Gabry et al., "Multi-Kernel Construction of Polar Codes," 2017 IEEE International Conference on Communications Workshops (ICC Workshops), XP055463941, total 6 pages, Institute of Electrical and Electronics Engineers, New York, New York (Mar. 2017).

\* cited by examiner

CONSTRUCTION OF A POLAR CODE BASED ON A DISTANCE CRITERION AND A RELIABILITY CRITERION, IN PARTICULAR OF A MULTI-KERNEL POLAR CODE

CROSS-REFERENCE TO RELATED APPLICATIONS

This application is a continuation of International Application No. PCT/EP2017/068930, filed on Jul. 26, 2017, the disclosure of which is hereby incorporated by reference in its entirety.

TECHNICAL FIELD

In general, the present disclosure relates to data encoding and decoding in communication systems. More specifically, the present disclosure relates to an apparatus and a method for encoding and decoding data using polar codes.

BACKGROUND

Reliable transmission of data over noisy communication channels requires some kind of error correction coding to be used. Polar codes are a class of channel codes introduced by Arikan in the work "Channel polarization: a method for constructing capacity-achieving codes for symmetric binary-input memoryless channels," IEEE Trans. Inf. Theo, July 2009. They are provably capacity-achieving over various classes of channels, and they provide excellent error rate performance for practical code lengths.

In their original construction according to the aforementioned work by Arikan, polar codes are based on the polarization effect of the Kronecker products of the matrix:

$$T_2 = \begin{pmatrix} 1 & 0 \\ 1 & 1 \end{pmatrix}.$$

This matrix is also called kernel of the polar code. A polar code of length N and dimension K is defined by a transformation matrix $G_N = T_2^{\otimes n}$, $N=2^n$, and a frozen set $F \subset [N]$, $[N]=\{0, 1, \ldots, N-1\}$, of size $|F|=N-K$. The information set is the complementary set of the frozen set, $I=[N]\backslash F$, of size $|I|=K$. For encoding, the elements $u_i$ of a binary input vector $u_N$ of length N are set to zero for $i \in F$, and to the information bits for $i \in I$. The polar code is obtained as $x_N = u_N \cdot G_N$.

As a consequence, only code lengths of the form $N=2^n$ can be generated. On the other hand, any code dimension (i.e., number of information bits) K is possible. Thus, polar codes admit any code rate R=K/N.

A drawback of the original construction of polar codes is that their code lengths are restricted to powers of 2, i.e., $N=2^n$. This is not sufficient in order to cover the diversity of block lengths demanded by modem communication systems.

In the prior art, different approaches have been suggested in order to solve the problem related to the length of polar codes, as elucidated in the following.

In the so-called puncturing or shortening techniques from coding theory, the codes can be trimmed to any code length, as proposed, for example, in the works: "A Novel Puncturing Scheme for Polar Codes", IEEE Comm. Lett., December 2014, by Wang et al., "On the Puncturing Patterns for Punctured Polar Codes", IEEE ISIT, July 2014, by Zhang et. al., and "Beyond Turbo Codes: Rate-Compatible Punctured Polar Codes", IEEE ICC, June 2013 by C. Kai et al. However, the main shortcomings of puncturing and shortening techniques of original polar codes are related to the lack of structure in the frozen sets and in the puncturing or shortening patterns generated by these methods. In particular, every modified code has a different frozen set and puncturing or shortening pattern, and, thus, these frozen sets and puncturing and/or shortening patterns have to be stored or calculated on the fly. Hence, these methods are not practical to implement due to their high latency and are not simple to describe in a systematic manner, such as tables of nested sets. Moreover, puncturing and shortening techniques generally lead to a loss in the error-rate performance compared to the full (non-shortened or non-punctured) code.

In order to solve the problem related to the code length of the original construction of polar codes, multi-kernel constructions of polar codes have also been proposed such as, for example, in PCT/EP2016/069593. It is worth noticing that the original polar codes are a special case of multi-kernel polar codes, wherein the block length is a power of 2 and only kernels $T_2$ are used. In these constructions, by using kernels of different dimensions, polar codes of block lengths that are not only powers of two (or more general powers of integers) can be obtained. This results in a multi-kernel polar code with a very good error-rate performance, while the encoding complexity remains low and the decoding follows the same general structure as for usual polar codes.

The main idea of the polar codes is that, based on successive-cancellation decoding as will be elucidated below, some input bit positions are more reliable than others due to a polarization phenomenon. This holds for multi-kernel polar codes as well, wherein the information bits are put in the most reliable positions of the input vector $u_N$, while the unreliable positions of the input vector are set to the fixed bit value 0, called also frozen bits, which form the frozen set, as described above. The reliabilities of the input bit positions can be obtained by density evolution, genie-aided simulation, or other similar methods (see, e.g., "A comparative study of polar code constructions for the AWGN channel," arXiv: 1501.02473, 2015, by H. Vangala et al.). However, in the prior art, multi-kernel polar codes are either solely based on the reliability constructions or are solely based on minimum distance constructions, leading to a poor block error rate (BLER) performance for codes having medium lengths. In particular, in the reliability constructions, as mentioned above, the information set, or equivalently the frozen set, is typically designed by first determining the reliabilities of the input bit positions using density evolution and, then, selecting the most reliable bits for the information. Such a construction is appropriate for long codes under successive-cancellation (SC) decoding. For short codes under successive-cancellation list (SCL) decoding, on the other hand, the effect of the polarization is less dominant, and the construction focusing on minimum distance is required. However, especially for codes having medium lengths none of these constructions is appropriate.

Thus, there is a need for an improved device and method for encoding and decoding data using polar codes.

SUMMARY

It is an object of the disclosure to provide for an improved device and method for encoding and decoding data using polar codes.

The foregoing and other objects are achieved by the subject matter of the independent claims. Further implementation forms are apparent from the dependent claims, the description and the figures.

According to a first aspect, the disclosure relates to a device for generating a polar code $x_N$ of length N and dimension K on the basis of a transformation matrix $G_N$ of size N×N, wherein the transformation matrix $G_N$ is based on a first matrix $G_{N_r}$ of size $N_r \times N_r$, and on a second matrix $G_{N_d}$ of size $N_d \times N_d$, wherein $N = N_r \cdot N_d$, and wherein the polar code $x_N$ is given by $x_N = u_N \cdot G_N$, wherein $u_N = (u_0, \ldots, u_{N-1})$ is a vector of size N, $u_i$, i=0, ... N−1, corresponding to an information bit if i∈I, I being a set of K information bit indices, and $u_i$=0, if i∈F, F being a set of N−K frozen bit indices. The device comprises a processor configured to: generate a reliability vector $$v_{G_{N_r}} = [v_1, \ldots v_{N_r}],$$

wherein $v_i$ represents a reliability of an i-th input bit of a code generated by the first matrix $G_{N_r}$, generate a distance spectrum vector $$d_{G_{N_d}} = [d_1, \ldots, d_{N_d}]$$

of a code generated by the second matrix $G_{N_d}$, wherein $d_j$ represents a minimum distance of the code generated by the second matrix $G_{N_d}$ of dimension j, determine the set of K information bit indices I on the basis of the reliability vector $v_{G_{N_r}}$ and of the distance spectrum vector $d_{G_N}$, and generate the polar code $c_N$ on the basis of the set of K information bit indices I.

The device according to the first aspect generates the polar code based on a design which combines both the technique based on the reliability construction and the technique based on the minimum distance construction. Thus, an improved device is provided, since it operates on the enhanced distance profile of the transformation matrix of the polar code, taking into account the reliabilities of the bits in order to improve the minimum distance design.

In a possible implementation form of the device according to the first aspect, the processor is further configured to generate the transformation matrix $G_N$ on the basis of the following equation:

$$G_N = G_{N_r} \otimes G_{N_d},$$

wherein $G_{N_r} = G_{p_1} \otimes \ldots \otimes G_{p_\lambda}$, $G_{N_d} = G_{p_{\lambda+1}} \otimes \ldots \otimes G_{p_s}$, $N_r = p_1 \cdots p_\lambda$, $N_d = p_{\lambda+1} \cdots p_s$, wherein $G_{p_j}$ is a kernel matrix and wherein λ is an integer assuming a value comprised in the interval [0, ..., s], s being the total number of kernel matrices $G_{p_j}$ forming the first matrix $G_{N_r}$ and the second matrix $G_{N_d}$.

Thus, an improved device with large flexibility is provided thanks to the parameter λ, which allows to switch from the reliability based construction to the distance based construction in an easy way. The two known extreme designs based only on reliability and only on the distance are special cases of the proposed design, corresponding to λ=0 and λ=s, respectively. The optimal value of λ can be calculated offline by means of simulations and stored in the device.

In a further possible implementation form of the device according to the first aspect, in order to determine the set of K information bit indices I, the processor is further configured to: determine an index l of the largest entry $z_l$ in a vector z with the largest value l, wherein the vector z is defined by $$z = v_{G_{N_r}} \otimes w,$$

wherein w is a vector defined by $w = [d_1, d_{N_d-1}, d_{N_d-2} \ldots, d_2, d_2]$, add the index l to the set of K information bit indices I and set the entry $z_l$ to zero, and if $l = (p_s - 1) \bmod p_s$, remove the index $(l - p_s + 1)$ from the set of K information bit indices I, add the index l−1 to the set of K information bit indices I, and set $z_{l-1} = 0$ and $z_{l-p_s+1} = z'_{l-p_s+1}$, wherein $z'_{l-p_s+1}$ denotes an element of a vector z', wherein the vector z' is defined by $$z' = v_{G_{N_r}} \otimes w',$$

wherein w' is a vector defined by $w' = [d_{N_d}, d_{N_d-1}, d_{N_d-2} \ldots, d_2, d_2]$.

In a further possible implementation form of the device according to the first aspect, in order to determine the set of K information bit indices I, the processor is further configured to initialize the set of K information bit indices I as an empty set, prior to determining the index l.

In a further possible implementation form of the device according to the first aspect, the polar code $x_N$ has length N=12, wherein the transformation matrix is given by $G_{12} = T_2 \otimes T_2 \otimes T_3$, with:

$$T_2 = \begin{pmatrix} 1 & 0 \\ 1 & 1 \end{pmatrix} \text{ and } T_3 = \begin{pmatrix} 1 & 1 & 1 \\ 1 & 0 & 1 \\ 0 & 1 & 1 \end{pmatrix}.$$

In a further possible implementation form of the device according to the first aspect, the processor is further configured to generate the reliability vector $v_{G_{N_r}}$ by calculating the reliability of the i-th input bit of the code generated by the first matrix $G_{N_r}$ on the basis of a density evolution algorithm or Monte-Carlo simulations.

According to a second aspect, the disclosure relates to a communication apparatus comprising a channel encoder comprising a device for generating a polar code according to the first aspect.

According to a third aspect, the disclosure relates to a communication apparatus comprising a channel decoder comprising a device for generating a polar code according to the first aspect.

In a possible implementation form of the communication apparatus according to the third aspect, the communication apparatus comprises a processor configured to decode the polar code on the basis of a successive-cancellation (SC) algorithm or a successive-cancellation list (SCL) algorithm.

According to a fourth aspect, the disclosure relates to a method for generating a polar code $x_N$ of length N and dimension K on the basis of a transformation matrix $G_N$ of size N×N, wherein the transformation matrix $G_N$ is based on a first matrix $G_{N_r}$ of size $N_r \times N_r$, and on a second matrix $G_{N_d}$ of size $N_d \times N_d$, wherein $N = N_r \cdot N_d$, and wherein the polar code $c_N$ is given by $x_N = u_N \cdot G_N$, wherein $u_N = (u_0, \ldots u_{N-1})$ is a vector of size N, $u_i$, i=0, ... N−1, corresponding to an information bit if i∈I, I being a set of K information bit indices, and $u_i=0$, if $i \in F$, F being a set of N−K frozen bit indices. The method comprising the steps of: generating a reliability vector $$v_{G_{N_r}} = [v_1, \ldots v_{N_r}],$$

wherein $v_i$ represents a reliability of an i-th input bit of a code generated by the first matrix $G_{N_r}$, generating a distance spectrum vector $$d_{G_{N_d}} = [d_1, \ldots, d_{N_d}]$$

of a code generated by the second matrix $G_{N_d}$, wherein $d_j$ represents a minimum distance of the code generated by the second matrix $G_{N_d}$ of dimension j, determining the set of K information bit indices I on the basis of the reliability vector $v_{G_{N_r}}$ and of the distance spectrum vector $d_{G_N}$, and generating the polar code $x_N$ on the basis of the set of K information bit indices I.

According to a fifth aspect, the disclosure relates to a computer program comprising a program code for performing the method of the fourth aspect when executed on a computer.

The disclosure can be implemented in hardware and/or software.

BRIEF DESCRIPTION OF THE DRAWINGS

Further embodiments of the disclosure will be described with respect to the following figures, wherein.

In the various figures, identical reference signs will be used for identical or at least functionally equivalent features.

DETAILED DESCRIPTION OF THE EMBODIMENTS

In the following description, reference is made to the accompanying drawings, which form part of the disclosure, and in which are shown, by way of illustration, specific aspects in which the present disclosure may be placed. It is understood that other aspects may be utilized and structural or logical changes may be made without departing from the scope of the present disclosure. The following detailed description, therefore, is not to be taken in a limiting sense, as the scope of the present disclosure is defined by the appended claims.

For instance, it is understood that a disclosure in connection with a described method may also hold true for a corresponding device or system configured to perform the method and vice versa. For example, if a specific method step is described, a corresponding device may include a unit to perform the described method step, even if such unit is not explicitly described or illustrated in the figures. Further, it is understood that the features of the various exemplary aspects described herein may be combined with each other, unless specifically noted otherwise.

Figure 1:
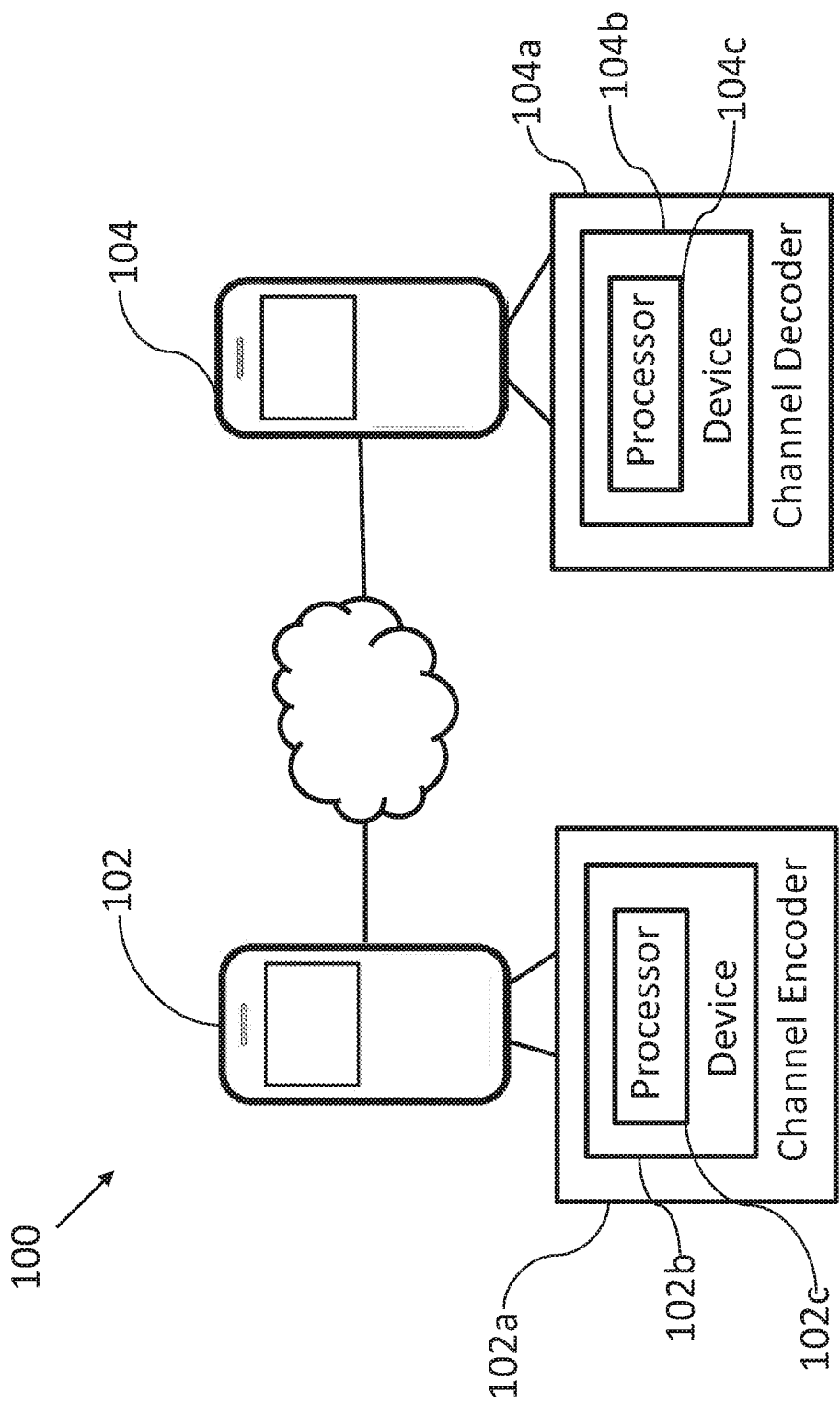
FIG. 1 shows a schematic diagram of a communication system comprising a communication apparatus comprising a device for generating a polar code according to an embodiment.

FIG. 1 shows a schematic diagram of a communication system 100 comprising a communication apparatus 102 comprising a device 102b for generating a polar code $x_N$ according to an embodiment.

The communication apparatus 102 comprises a channel encoder 102a, wherein the channel encoder comprises the device 102b for generating the polar code $x_N$ of length N and dimension K on the basis of a transformation matrix $G_N$ of size N×N according to an embodiment.

The transformation matrix $G_N$ is based on a first matrix $G_{N_r}$ of size $N_r \times N_r$, and on a second matrix $G_{N_d}$ of size $N_d \times N_d$, wherein $N = N_r \cdot N_d$, and wherein the polar code $x_N$ is given by $x_N = u_N \cdot G_N$, wherein $u_N = (u_0, \ldots u_{N-1})$ is a vector of size N, $u_i$, $i=0, \ldots N-1$, corresponding to an information bit if $i \in I$, I being a set of K information bit indices, and $u_i=0$, if $i \in F$, F being a set of N−K frozen bit indices.

The device 102b comprises a processor 102c configured to: generate a reliability vector $$v_{G_{N_r}} = [v_1, \ldots v_{N_r}],$$

wherein $v_i$ represents a reliability of an i-th input bit of a code generated by the first matrix $G_{N_r}$, generate a distance spectrum vector $$d_{G_{N_d}} = [d_1, \ldots, d_{N_d}]$$

of a code generated by the second matrix $G_{N_d}$, wherein $d_j$ represents a minimum distance of the code generated by the second matrix $G_{N_d}$ of dimension j, determine the set of K information bit indices I on the basis of the reliability vector $v_{G_{N_r}}$ and of the distance spectrum vector $d_{G_N}$, and generate the polar code $x_N$ on the basis of the set of K information bit indices I.

Thus, the device 102b advantageously allows for a construction of polar codes, in particular of multi-kernel polar codes, which makes use of both the bit-channel reliabilities and the distance properties. The processor 102c can be configured to combine the reliability and distance techniques in order to design or generate the set of frozen bit indices (or, equivalently, the set of information bit indices) of the multi-kernel polar code in such a way that the performance of the polar code is enhanced.

Thus, an improved device 102b is provided, since it operates on the enhanced distance profile of the transformation matrix $G_N$ of the polar code $x_N$, taking into account the reliabilities of the bits in order to improve the minimum distance design. For example, simulations show excellent BLER performance for the proposed design under SC list decoding (with list length 8) for exemplary codes having medium lengths (N~100 . . . 1000).

In an embodiment the transformation matrix $G_N$ is a multi-kernel polar code matrix given by:

$$G_N = G_{N_r} \otimes G_{N_d},$$

wherein $G_{N_r} = G_{p_1} \otimes \ldots \otimes G_{p_\lambda}$, $G_{N_d} = G_{p_{\lambda+1}} \otimes \ldots \otimes G_{p_s}$, $N_r = p_1 \cdot \ldots \cdot p_\lambda$, $N_d = p_{\lambda+1} \cdot \ldots \cdot p_s$, wherein $G_{p_j}$ is a kernel matrix and wherein λ is an integer assuming a value comprised in the interval $[0, \ldots, s]$, s being the total number of kernel matrices $G_{p_j}$ forming the first matrix $G_{N_r}$ and the second matrix $G_{N_d}$. The first matrix $G_{N_r}$ and the second matrix $G_{N_d}$ can be treated as transformation matrices of smaller multi-kernel polar codes, of length $N_r = p_1 \cdot \ldots \cdot p_\lambda$ and $N_d = p_{\lambda+1} \cdot \ldots \cdot p_s$, respectively.

Furthermore, the processor 102c can be configured to generate a reliability vector $v_{G_{N_r}} = [v_1, \ldots v_{N_r}]$, wherein $v_i$ represents a reliability of an i-th input bit of a code generated by the first matrix $G_{N_r}$ on the basis of a density evolution algorithm (DE/GA, see, e.g., "Performance of Polar Codes with the Construction using Density Evolution", by R. Mori et al., IEEE Comm. Letters, July 2009), Monte-Carlo simulations or a similar method. In particular, the value of $v_i$ is related to the probability of making an error under SC decoding of the i-th input bit assuming that the previous input bits were correctly decoded.

The minimum distances achievable for the input bits of the second matrix $G_{N_d}$, and thus the minimum-distance spectrum, can be computed as it will be described in the following.

The processor 102c can be configured to calculate the distance spectrum of a multi-kernel polar code as the Kronecker product of the distance spectra of the kernels forming the transformation matrix $G_{N_d}$, sorted in descending order. After generating the distance spectrum vector $$d_{G_{N_d}} = [d_1, \ldots, d_{N_d}]$$

of a code generated by the second matrix $G_{N_d}$, as explained above, the processor 102c can further be configured to calculate a vector $w = [d_1, d_{N_d-1}, d_{N_d-2}, \ldots, d_2, d_2]$ and a vector $w' = [d_{N_d}, d_{N_d-1}, d_{N_d-2}, \ldots, d_2, d_2]$, which are used to generate the polar code $x_N$.

Moreover, given the pre-calculated vectors $v_{G_{N_r}}$, w and w', the processor 102c can be configured to calculate the vectors $$z = v_{G_{N_r}} \otimes w \text{ and } z' = v_{G_{N_r}} \otimes w',$$

and use z and z' in order to generate the code $x_N$. Therefore, the vector z and the vector z' contain information about the reliability and distance.

The processor 102c can also be configured to execute an algorithm which initializes the information set an empty set, and then to add sequentially, step-by-step, one row index to the information set. Then, at each step, the position l of the largest entry $z_l$ in the vector z with the largest value l is determined, and this index l is added to the information set, while the entry $z_l$ itself is set to zero. In addition, if $l = (p_s - 1)$ mod $p_s$, the index $(l - p_s + 1)$ is removed from the information set, and the index l−1 is added to the set of K information bit indices I, while the algorithm sets $z_{l-1} = 0$ and $z_{l-p_s+1} = z'_{l-p_s+1}$. The algorithm stops when the information set comprises K elements. The remaining N−K elements form the frozen set. The processor 102c con be configured to stop adding bit indices to the set of K information bit indices I, when the number of elements or indices contained in the set of information bit indices I is equal to K.

The additional part is required, as by construction, $(l - p_s + 1)$ should be not be in the information set any more in the step where 1 is added. Furthermore, this part is possible, as (l−1) is not yet in the set of K information bit indices I at this stage.

Once, the polar code $x_N$ is generated, the communication apparatus 102 can be configured to send it to the communication apparatus 104 via a communication channel.

In an embodiment, the communication apparatus 104 comprises a channel decoder 104a, wherein the channel decoder 104a comprises a device 104b for generating a polar code as described above. Moreover, the communication apparatus 104 can comprise a processor 104c configured to decode the polar code on the basis of a successive-cancellation (SC) algorithm or a successive-cancellation list (SCL) algorithm.

Figure 2:
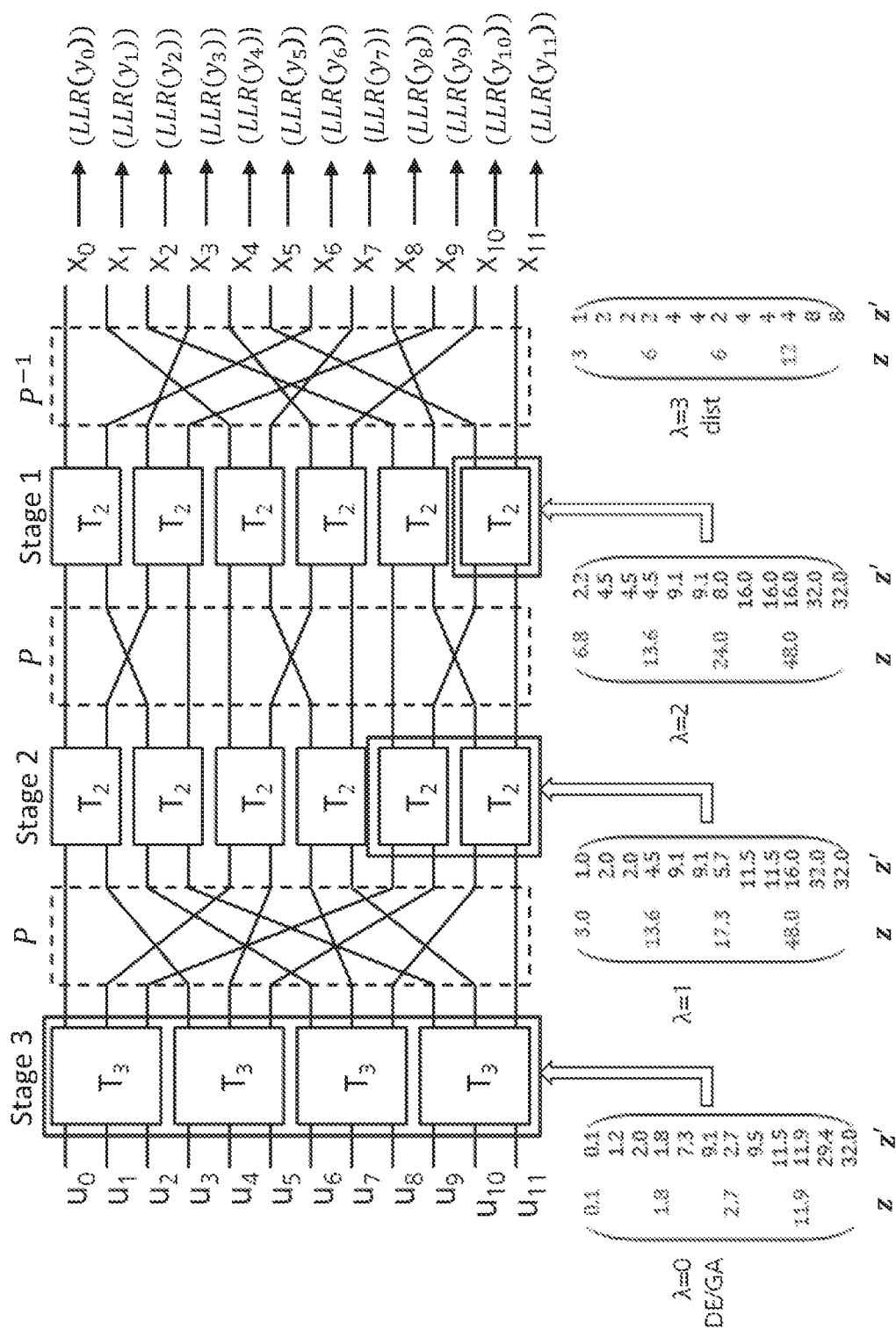
FIG. 2 shows a schematic diagram illustrating a Tanner graph of a polar code generated by a device according to an embodiment.

FIG. 2 shows a schematic diagram illustrating a Tanner graph of a polar code generated by the device 102b according to an embodiment.

In general, the relationship between the input vector $u_N$ and the polar code $x_N$ can be represented by a Tanner graph. An example of a Tanner graph is illustrated in FIG. 2 for a polar code of length N=12 and transformation matrix $G_{12} = T_2 \otimes T_2 \otimes T_3$. In this embodiment, the Tanner graph of the polar code $x_N$ is given by three stages or layers which are denoted by Stage 1, Stage 2, and Stage 3, respectively. The last two stages (Stage 3 and Stage 2) are connected by an edge permutation P of length 12, while the first stage (Stage 1) is connected to the polar code by the inverse edge permutation $P^{-1}$.

Moreover, in FIG. 2 the vectors z and z' for all possible values of the parameter $\lambda = 0, \ldots, 3$ are depicted as well. In particular, the parameter $\lambda$ indicates the stage or layer in the Tanner graph of the polar code $x_N$ in which the reliability construction and the distance construction are combined. The reliabilities of the bits up to layer $\lambda$ can be calculated according to the reliability construction mentioned above. The reliability vector $v_{G_{N_r}}$ can then be used in the minimum distance design algorithm as the spectrum of the first $\lambda$ layers. The result is a mixed profile of the polar code $x_N$. In particular, an embodiment with $\lambda = 0$ corresponds to the reliability-based construction only, while an embodiment with $\lambda = s$, wherein s is the number of kernels used in the generation of the transformation matrix, corresponds the minimum-distance-based construction only. Therefore, in FIG. 2, the cases with $\lambda = 0$ and $\lambda = 3$ represent the reliability-based design (labeled DE/GA) and the minimum-distance-based design (labeled dist), respectively.

In the following table, the information sets obtained for different values of $\lambda$ for a polar code $x_N$ of dimension K=4 are listed:

TABLE 1

Information sets for different parameters $\lambda$ for code length N = 12

| $\lambda$ | Information set |
|---|---|
| 0 (DE/GA) | $u_8, u_9, u_{10}, u_{11}$ |
| 1 | $u_6, u_9, u_{10}, u_{11}$ |
| 2 | $u_6, u_9, u_{10}, u_{11}$ |
| 3 (dist) | $u_3, u_6, u_{10}, u_{11}$ |

As it can be taken from table 1, the information set depends on the choice of the parameter $\lambda$. An optimal choice of the parameter $\lambda$ can be done on the basis of numerical simulations.

Once the polar code $x_N$ is generated, the communication apparatus 102 can be configured to send the polar code $x_N$ to the communication apparatus 104. The processor 104c of the communication apparatus 104 can be configured to decode the received polar code $x_N$ affected by the propagation through the communication channel, namely the vector of noisy symbols $y_N=(y_0, y_1, y_2, y_3, y_4, y_5, y_6, y_7, y_8, y_9, y_{10}, y_{11})$.

The processor 104c can be configured to perform a successive cancellation (SC) or successive cancellation list (SCL) decoding of the vector of noisy symbols $y_N$, in order to get an estimate of the sent polar code $x_N$. In the case of SC decoding, the input bits (corresponding to the ones on the left side of the Tanner graph) can be decoded successively from top to bottom by propagating the log-likelihood-ratio (LLR) values from right to left and hard-decisions (partial sums) from left to right (see, the aforementioned work by Arikan). The LLRs $L^{(0)}, \ldots, L^{(1)}$ appearing at the right-most side correspond to the channel observations. LLRs and hard-decisions can be computed according to update functions which can be found in the aforementioned work by Arikan. As an alternative to SC decoding, SC list decoding (see, the work by I. Tal et. al, "List decoding of polar codes," in IEEE ISIT, July 2011) or similar decoding methods can be used as well.

Figure 3:
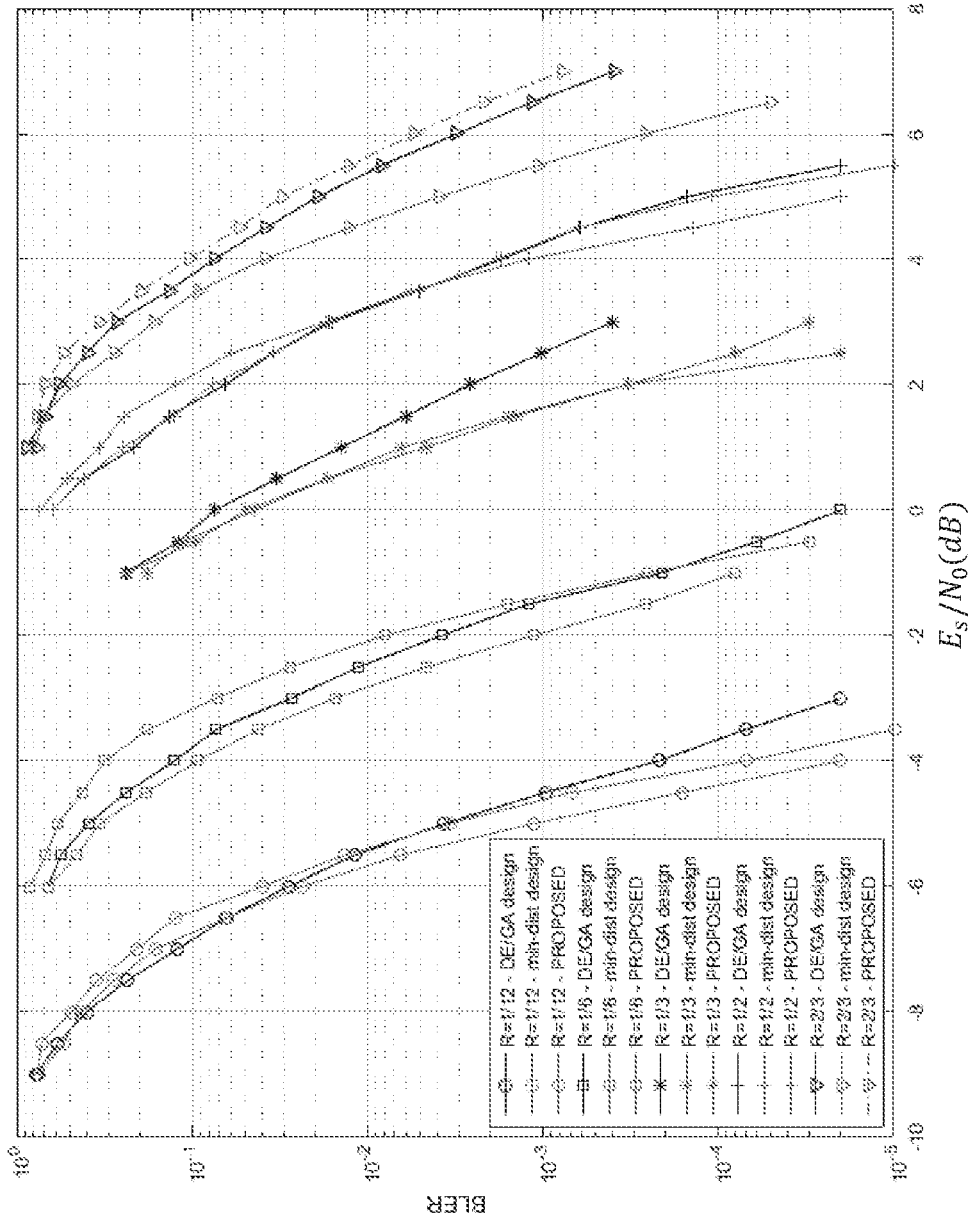
FIG. 3 shows a schematic diagram illustrating the performance of polar codes generated by a device according to an embodiment.

FIG. 3 shows a schematic diagram illustrating the performance of polar codes generated by the device 102b according to an embodiment.

In FIG. 3, the block error rate (BLER) of multi-kernel polar codes constructed according to embodiments of the disclosure (labeled PROPOSED) is shown as a function of the signal to noise ration $E_s/N_0$ in dB. In this embodiment, a transmission with binary phase shift keying (BPSK) over an additive white Gaussian noise (AWGN) channel and list decoding with list size L=8 are used (see, I. Tal et. al, "List decoding of polar codes," in IEEE ISIT, July 2011).

In this embodiment, the design parameter is given by $\lambda=1$, and the constructed polar codes have a dimension K=48, and lengths N=576, 288, 144, 96, 72. Moreover, the performance of polar codes according to embodiments of the disclosure (PROPOSED case) is compared to the construction of polar codes based only on the reliability design (see, PCT/EP2016/069593), denoted by DE/GA design in the figure, and on the minimum distance design (see, PCT/EP2016/082555), denoted by min-dist design in the figure.

As it can be taken from FIG. 3, the performance of polar codes constructed according to embodiments of the disclosure is better than the performance of the polar codes constructed using other designs, especially for lengths N>200. For very short codes, the polar codes constructed by using the minimum-distance-based design, obtained by setting $\lambda=s$, outperform the other designs.

Figure 4:
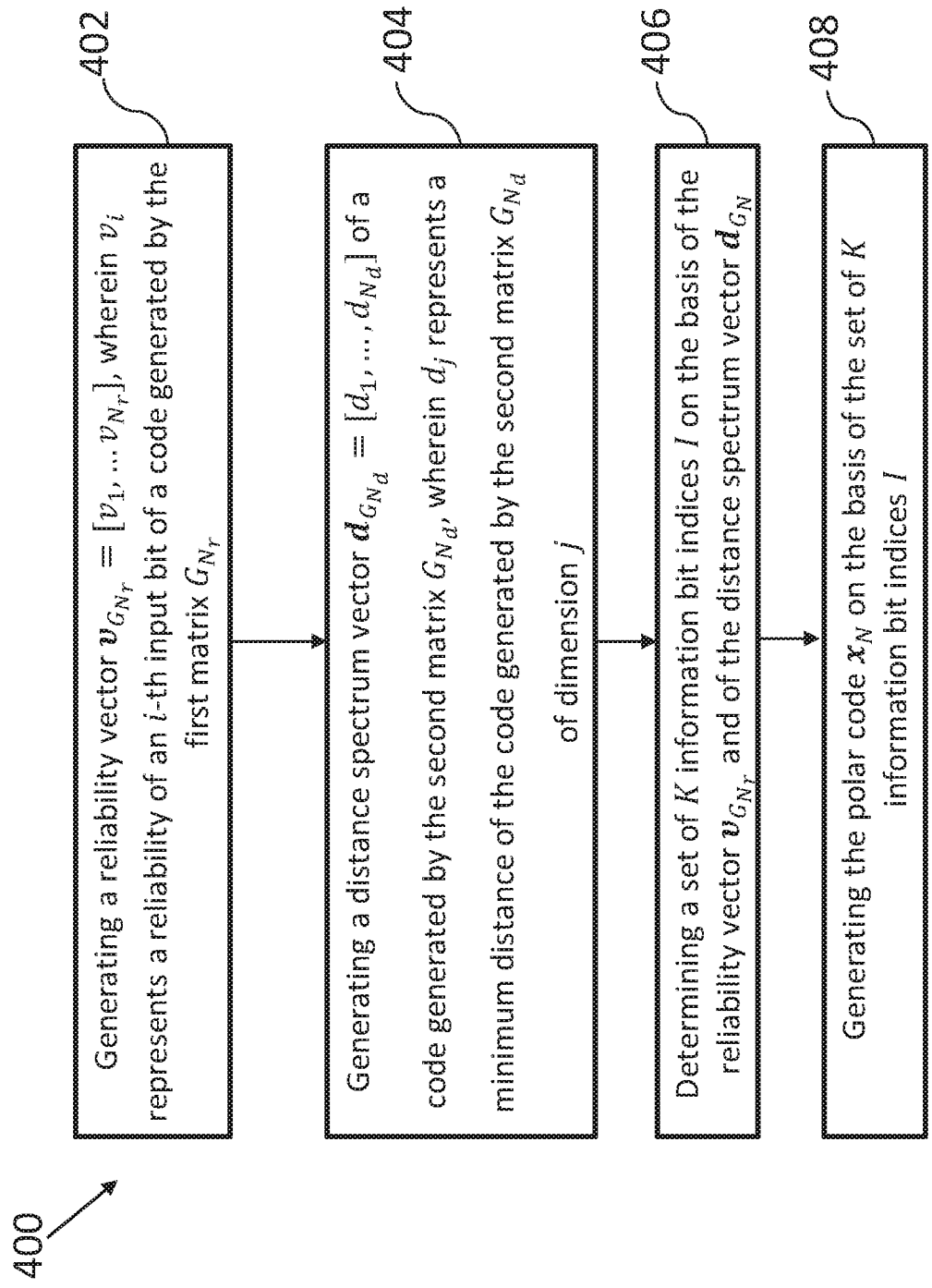
FIG. 4 shows a schematic diagram of a method for generating a polar code according to an embodiment.

FIG. 4 shows a schematic diagram of a method 400 for generating a polar code $x_N$ of length N and dimension K on the basis of a transformation matrix $G_N$ of size N×N according to an embodiment.

The transformation matrix $G_N$ is based on a first matrix $G_{N_r}$ of size $N_r \times N_r$, and on a second matrix $G_{N_d}$ of size $N_d \times N_d$, wherein $N=N_r \cdot N_d$, and wherein the polar code $x_N$ is given by $x_N=u_N \cdot G_N$, wherein $u_N=(u_0, \ldots, u_{N-1})$ is a vector of size N, $u_i$, i=0, ... N-1, corresponding to an information bit if i∈I, I being a set of K information bit indices, and $u_i=0$, if i∈ F, F being a set of N-K frozen bit indices.

The method 400 comprises the steps of: generating 402 a reliability vector $$v_{G_{N_r}} = [v_1, \ldots v_{N_r}],$$

wherein $v_i$ represents a reliability of an i-th input bit of a code generated by the first matrix $G_{N_r}$, generating 404 a distance spectrum vector $$d_{G_{N_d}} = [d_1, \ldots, d_{N_d}]$$

of a code generated by the second matrix $G_{N_d}$, wherein $d_j$ represents a minimum distance of the code generated by the second matrix $G_{N_d}$ of dimension j, determining 406 the set of K information bit indices I on the basis of the reliability vector $v_{G_{N_r}}$ and of the distance spectrum vector $d_{G_{N_d}}$, and generating 408 the polar code $c_N$ on the basis of the set of K information bit indices I.

While a particular feature or aspect of the disclosure may have been disclosed with respect to only one of several implementations or embodiments, such feature or aspect may be combined with one or more other features or aspects of the other implementations or embodiments as may be desired and advantageous for any given or particular application. Furthermore, to the extent that the terms "include", "have", "with", or other variants thereof are used in either the detailed description or the claims, such terms are intended to be inclusive in a manner similar to the term "comprise". Also, the terms "exemplary", "for example" and "e.g." are merely meant as an example, rather than the best or optimal. It should be understood that the terms "coupled" and "connected", along with similar terms or derivatives, may have been used to indicate that two elements cooperate or interact with each other regardless whether they are in direct physical or electrical contact, or they are not in direct contact with each other.

Although specific aspects have been illustrated and described herein, it will be appreciated by those of ordinary skill in the art that a variety of alternate and/or equivalent implementations may be substituted for the specific aspects shown and described without departing from the scope of the present disclosure. This application is intended to cover any adaptations or variations of the specific aspects discussed herein.

Although the elements in the following claims are recited in a particular sequence with corresponding labeling, unless the claim recitations otherwise imply a particular sequence for implementing some or all of those elements, those elements are not necessarily intended to be limited to being implemented in that particular sequence.

Many alternatives, modifications, and variations will be apparent to those skilled in the art in light of the above teachings. Of course, those skilled in the art readily recognize that there are numerous applications of the disclosure beyond those described herein. While the present disclosure has been described with reference to one or more particular embodiments, those skilled in the art recognize that many changes may be made thereto without departing from the scope of the present disclosure. It is therefore to be understood that within the scope of the appended claims and their equivalents, the disclosure may be practiced otherwise than as specifically described herein.

What is claimed is:

1. A channel encoder including a device for generating a polar code $x_N$ of length N and dimension K, the device comprising:

a processor configured to:
generate a reliability vector $$v_{G_{N_r}} = [v_1, \ldots v_{N_r}],$$

wherein $v_i$ represents a reliability of an i-th input bit of a code generated by a first matrix $G_{N_r}$ of size $N_r \times N_r$;
generate a distance spectrum vector $$d_{G_{N_d}} = [d_1, \ldots, d_{N_d}]$$

of a code generated by a second matrix $G_{N_d}$ of size $N_d \times N_d$, wherein $d_j$ represents a minimum distance of the code generated by the second matrix $G_{N_d}$, the distance spectrum vector $d_{G_{N_d}}$ having dimension j;
determine a set of K information bit indices I on the basis of the reliability vector $v_{G_{N_r}}$ and of the distance spectrum vector $d_{G_{N_d}}$;
generate the polar code $x_N$ on the basis of the set of K information bit indices I; and
transmit the polar code $x_N$ to a channel decoder via a communication channel,
wherein:

$$N = N_r \cdot N_d,$$

the polar code $x_N$ is given by $x_N = u_N \cdot G_N$,
a transformation matrix $G_N$ of size N×N is based on the first matrix $G_{N_r}$ and on the second matrix $G_{N_d}$,
$u_N = (u_0, \ldots, u_{N-1})$ is a vector of size N, and
an element $u_i$, i=0, ... N−1, of the vector corresponding to an information bit if i∈I, and $u_i$=0, if i∈F, F being a set of N−K frozen bit indices.

2. The channel encoder of claim 1, wherein the processor is further configured to generate the transformation matrix $G_N$ on the basis of the following equation:

$$G_N = G_{N_r} \otimes G_{N_d},$$

wherein $G_{N_r} = G_{p_1} \otimes \ldots \otimes G_{p_\lambda}$, $G_{N_d} = G_{p_{\lambda+1}} \otimes \ldots \otimes G_{p_s}$, $N_r = p_1 \cdot \ldots \cdot p_\lambda$, $N_d = p_{\lambda+1} \cdot \ldots \cdot p_s$, wherein $G_{p_j}$ is a kernel matrix and wherein λ is an integer assuming a value comprised in the interval [0, ..., s], s being the total number of kernel matrices $G_{p_j}$ forming the first matrix $G_{N_r}$ and the second matrix $G_{N_d}$.

3. The channel encoder of claim 1, wherein, in order to determine the set of K information bit indices I, the processor is further configured to:
determine an index l of the largest entry $z_l$ in a vector z with the largest value l, wherein the vector z is defined by $$z = v_{G_{N_r}} \otimes w,$$

wherein w is a vector defined by $w=[d_1, d_{N_d-1}, d_{N_d-2}, \ldots, d_2, d_2]$;
add the index l to the set of K information bit indices I and set the entry $z_l$ to zero; and if l=$(p_s-1)$ mod $p_s$, remove the index $(l-p_s+1)$ from the set of K information bit indices I, add the index l−1 to the set of K information bit indices l, and set $z_{l-1}$=0 and $z_{l-p_s+1}=z'_{l-p_s+1}$, wherein $z'_{l-p_s+1}$ denotes an element of a vector z', wherein the vector z' is defined by $$z' = v_{G_{N_r}} \otimes w',$$

wherein w' is a vector defined by $w'=[d_{N_d}, d_{N_d-1}, d_{N_d-2}, \ldots, d_2, d_2]$.

4. The channel encoder of claim 3, wherein in order to determine the set of K information bit indices I, the processor is further configured to:
initialize the set of K information bit indices I as an empty set, prior to determining the index l.

5. The channel encoder of claim 1, wherein the polar code $x_N$ has length N=12, wherein the transformation matrix is given by $G_{12}=T_2 \otimes T_2 \otimes T_3$, with:

$$T_2 = \begin{pmatrix} 1 & 0 \\ 1 & 1 \end{pmatrix} \text{ and } T_3 = \begin{pmatrix} 1 & 1 & 1 \\ 1 & 0 & 1 \\ 0 & 1 & 1 \end{pmatrix}.$$

6. The channel encoder of claim 1, wherein the processor is further configured to generate the reliability vector $v_{G_{N_r}}$ by calculating the reliability of the i-th input bit of the code generated by the first matrix $G_{N_r}$ on the basis of a density evolution algorithm or Monte-Carlo simulations.

7. A method for generating a polar code $x_N$ of length N and dimension K, the method comprising the steps of:
generating a reliability vector $$v_{G_{N_r}} = [v_1, \ldots v_{N_r}],$$

wherein $v_i$ represents a reliability of an i-th input bit of a code generated by the first matrix $G_{N_r}$ of size $N_r \times N_r$;
generating a distance spectrum vector $$d_{G_{N_d}} = [d_1, \ldots, d_{N_d}]$$

or a cone generated by the second matrix $G_{N_d}$ of size $N_d \times N_d$, wherein $d_j$ represents a minimum distance of the code generated by the second matrix $G_{N_d}$, the distance spectrum vector $d_{G_{N_d}}$ having dimension j;
determining a set of K information bit indices I on the basis of the reliability vector $v_{G_{N_r}}$ and of the distance spectrum vector $d_{G_{N_d}}$; and
generating the polar code $x_N$ on the basis of the set of K information bit indices I; and
transmitting the polar code $x_N$ to a channel decoder via a communication channel,
wherein:

$$N = N_r \cdot N_d,$$

the polar code $x_N$ is given by $x_N = u_N \cdot G_N$,
a transformation matrix $G_N$ of size N×N is based on the first matrix $G_{N_r}$ and on the second matrix $G_{N_d}$, $u_N = (u_0, \ldots, u_{N-1})$ is a vector of size N, and an element $u_i$, $i = 0, \ldots N-1$, of the vector corresponding to an information bit if $i \in I$, and $u_i = 0$, if $i \in F$, F being a set of N−K frozen bit indices.

8. A non-transitory computer readable medium storing a computer program comprising a program code for performing the method of claim 7 when executed by a processor.

* * * * *

UNITED STATES PATENT AND TRADEMARK OFFICE
CERTIFICATE OF CORRECTION

PATENT NO. : 11,190,214 B2
APPLICATION NO. : 16/773544
DATED : November 30, 2021
INVENTOR(S) : Bioglio et al.

It is certified that error appears in the above-identified patent and that said Letters Patent is hereby corrected as shown below:

In the Claims

Claim 2 Column 11, Line 47: "$N_r = p_1 \cdot \ldots \cdot_\lambda$, $N_d = p_{\lambda+1} \cdot \ldots \cdot p_s$, wherein $G_{p_j}$ is a kernel" should read -- $N_r = p_1 \cdot \ldots \cdot p_\lambda$, $N_d = p_{\lambda+1} \cdot \ldots \cdot p_s$, wherein $G_{p_j}$ is a kernel --.

Claim 7 Column 12, Line 50: "or a cone generated by the second matrix $G_{N_d}$ of size" should read -- of a code generated by the second matrix $G_{N_d}$ of size --.

Signed and Sealed this
Fourteenth Day of June, 2022

*Katherine Kelly Vidal*

Katherine Kelly Vidal
*Director of the United States Patent and Trademark Office*